(12) United States Patent
Van Dalen et al.

(10) Patent No.: US 7,154,177 B2
(45) Date of Patent: Dec. 26, 2006

(54) SEMICONDUCTOR DEVICE WITH EDGE STRUCTURE

(75) Inventors: Rob Van Dalen, Eindhoven (NL); Christelle Rochefort, Haasrode (BE)

(73) Assignee: NXP B.V., Eindhoven (NL)

( * ) Notice: Subject to any disclaimer, the term of this patent is extended or adjusted under 35 U.S.C. 154(b) by 179 days.

(21) Appl. No.: 10/518,267

(22) PCT Filed: Jun. 13, 2003

(86) PCT No.: PCT/IB03/02929
§ 371 (c)(1),
(2), (4) Date: Dec. 16, 2004

(87) PCT Pub. No.: WO04/001854
PCT Pub. Date: Dec. 31, 2003

(65) Prior Publication Data
US 2005/0173776 A1    Aug. 11, 2005

(30) Foreign Application Priority Data
Jun. 25, 2002   (GB)   ................................. 0214618.1

(51) Int. Cl.
*H01L 29/40*   (2006.01)
(52) U.S. Cl. ...................................... 257/750; 438/298
(58) Field of Classification Search ................ 257/734, 257/750, 751, 622, 958, 298
See application file for complete search history.

(56) References Cited

U.S. PATENT DOCUMENTS

| 6,452,230 B1 | 9/2002 | Boden | |
| 6,670,650 B1 * | 12/2003 | Nemoto et al. | ............. 257/144 |
| 6,855,970 B1 * | 2/2005 | Hatakeyama et al. | ........ 257/264 |

FOREIGN PATENT DOCUMENTS

| EP | 1 267 415 A | 12/2002 |
| WO | WO 02 065552 A | 8/2002 |

* cited by examiner

*Primary Examiner*—Roy Karl Potter
(74) *Attorney, Agent, or Firm*—Peter Zawilski

(57) ABSTRACT

A semiconductor device has an edge termination region (15) having a plurality of trenches (17). Conductive material (20) and insulating material (19) is formed at the trenches, and surface implants (21) are formed on either side of the trenches. A conductive bridge (23) connects the surface implants (21) to allow equilibrium to be reached in reverse bias.

10 Claims, 4 Drawing Sheets

SEMICONDUCTOR DEVICE WITH EDGE STRUCTURE

The invention relates to a semiconductor device having an edge termination, particularly an edge termination structure for a high-voltage semiconductor device, together with a method of manufacturing such a device.

Conventional reduced surface field (RESURF) semiconductor devices are manufactured on a semiconductor substrate using epitaxial growth and implantation processes. Such devices may be either vertical, in which current passes through the device substantially perpendicular to the plane of the semiconductor substrate or horizontal, i.e. with current passing through the device across the substrate.

A typical RESURF structure is a diode, transistor (such as a MOSFET), or thyristor having a region, often known as the drift region, that is depleted in reverse bias at a voltage much less than breakdown. Increased reverse bias voltage will then lead to a relatively flat field profile. This enables the structure to support a larger voltage across it without breaking down in reverse bias than would otherwise be possible. This may be achieved, for example, by providing a plurality of p-type regions in an n-type drift region so that in reverse bias the depletion region of the p-n junctions includes substantially the whole of the drift region. Thus, RESURF structures may be used in high voltage applications.

For vertical RESURF structures, deep p-n junctions are required and it can be more convenient to manufacture these using a trench etch process, avoiding the need for multiple epitaxy. Some other advantages may be obtained using a trench structure. These may include smaller pitch sizes due to a lower thermal budget which lowers the breakdown voltage at which vertical RESURF devices become attractive, and which also offer lower specific resistances. Trench etching can potentially result in a cheaper process with less processing steps.

The trenches in the active areas of multiple RESURF devices with trenches may be discrete columns extending into the substrate, stripes or close-packed shapes, for example, hexagonal or square lattice patterns of trenches. In many cases, better results are obtained using a stripe or close-packed design than is obtained by using columns, since such designs offer better RESURF at the same pitch, i.e. the same spacing between trenches.

The skilled person will be aware of many structures that also suitable at high voltages, not just RESURF structures.

For high voltage devices, a proper edge termination is required. Otherwise, the high voltages required may cause electrical breakdown in the edge region of the semiconductor device.

A number of edge termination structures have been proposed. For example, WO 99/23703 (Siemens A G) discloses the use of a number of p⁻ guard rings provided in trenches in an n⁻ epitaxial layer.

An alternative structure is taught in EP 1011146 (ST Microelectronics Srl), which discloses an integrated edge structure having p implants at different depths to form the edge termination structure. It is also possible to provide an additional implant at the surface to prevent depletion of the top of the p-type regions.

However, these prior art solutions rely on a very accurate doping concentration profile, laterally as well as horizontally, as the idea involves depleting the whole of the edge structure by choosing the dopant distribution so that the electric field does not exceed the critical field anywhere. Such a very accurate doping concentration profile is of course difficult to achieve in practice, and raises the cost of the device.

According to the invention there is provided a semiconductor body having opposed first and second surfaces and an edge termination region at the periphery of the semiconductor body; a plurality of edge termination trenches extending across the edge termination region of the semiconductor body and vertically from the first surface towards the second surface of the semiconductor body through a region of a first conductivity type; conductive material extending vertically at the edge termination trenches for depleting the region of a first conductivity type between adjacent trenches; insulating material extending vertically at the edge termination trenches; surface implants of second conductivity type opposite to the first conductivity type extending parallel to and along both sides of the edge termination trenches adjacent to the first surface; and an electrically conductive path associated with each edge termination trench forming an electrical connection between the surface implants on both sides of the edge termination trench.

The use of stripe or close-packed RESURF structures in the active region of a semiconductor device makes it difficult to build an edge termination out of column-like structures because the column-like structures would need to be closer together or have overly wide trench regions due to the fact that RESURF effect is much less with columns. Thus, it is preferable that the RESURF structures in the edge termination extend laterally across the edge termination region.

The inventors have however realised that there is a problem with laterally extending insulated trenches as the edge termination structure. As will be explained below, for the edge termination structure to work properly, it is necessary for charge to be transferred between the p-n junction formed on one side of the trench with the p-n junction on the other side of the trench. Accordingly, the inventors have realised that when using insulated trenches, it is necessary to provide an electrically conductive path between the two sides of the trench for the structure to work properly.

In embodiments of the invention, the semiconductor body has a central active device region, and the edge termination region surrounds the central active device region.

The plurality of edge termination trenches may have different depths, the trenches adjacent to the central region of the semiconductor device being deeper than the trenches adjacent to the periphery.

Preferably, the conductive material extending vertically at the trenches is of the second conductivity type.

The electrically conductive path may be formed by a conductive layer filling at least the portion of the edge termination trenches adjacent to the first surface. Alternatively, the electrically conductive path may be formed by a conductive layer extending over the first surface transversely across the edge termination trenches between the surface implants on both sides of the edge termination trenches.

The electrically conductive path may be of doped polysilicon, metal, or other suitable material. Doped polysilicon is particularly suitable.

In embodiments, the conductive material is a conductive layer on the sidewalls of the edge termination trenches extending downwards from the surface implants on both sides of the trench; and the insulating material fills the trenches between the conductive layers on the sides of the trench.

In alternative embodiments, the insulating material is an insulating layer extending downwards on the sidewalls of the edge termination trenches; the conductive material fills the trench between the insulating material on the sidewalls.

The invention also relates to a method of manufacturing a semiconductor device, including providing a semiconductor body having opposed first and second surfaces and a semiconductor region of first conductivity type adjacent to the first surface; forming trenches extending laterally across the semiconductor body and vertically from the first surface towards the second surface; filling the trenches with insulating material; forming conducting semiconductor regions of second conductivity type opposite to the first conductivity type along both sides of the trenches; and depositing conductive material on the first surface at the trenches to form a conductive path between the conducting semiconductor regions on both sides of the trenches.

The invention will now be described, purely by way of example, with reference to the accompanying drawings, in which.

Figure 1:
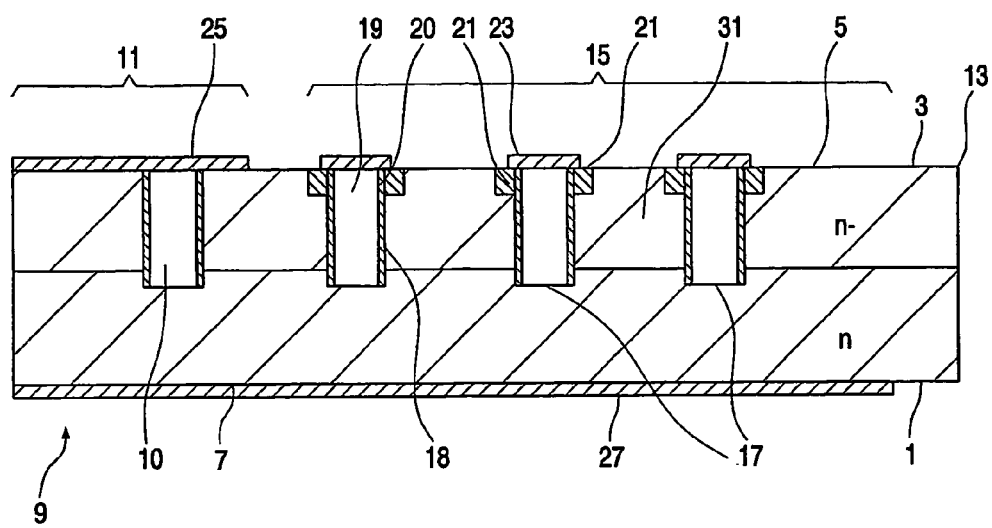
FIG. 1 shows a side view through a structure in accordance with the invention.
Figure 2:
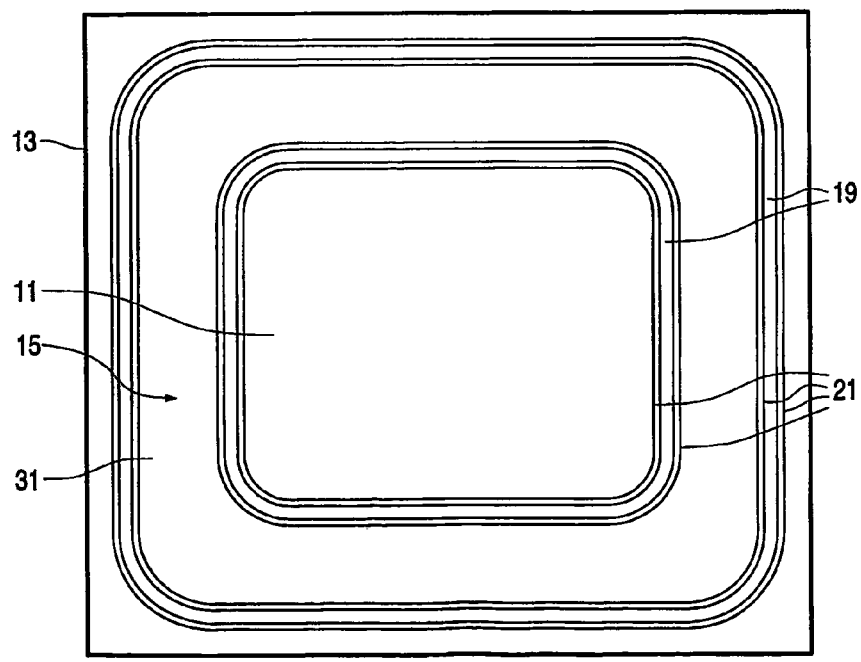
FIG. 2 shows a top view of a structure according to FIG. 1.

Referring to FIGS. 1 and 2, an n-type semiconductor substrate 1 has an n⁻ type epitaxial layer 3 deposited on one side. These two layers form a semiconductor body 9 having first and second surfaces: the second surface 7 is formed by the rear of the semiconductor substrate 1 and the first surface 5 formed by the top of the epitaxial layer 3.

The central active device region 11 on the semiconductor body 9 is formed with active vertical device structures in a manner well known to the person skilled in the art. In the specific embodiment disclosed, a vertical RESURF structure having trenches 70 is provided. Between the central region 11 and the peripheral edge 13 of the semiconductor body 9, is provided the edge termination region 15 which has the edge termination structure of the present invention.

A plurality of trenches 17 extend laterally (see FIG. 2) across the first surface 5 of the semiconductor body 9 around the central region 11. As may be seen from FIG. 2, the trenches surround the central region 11. The side walls 18 of the trenches are doped p-type to form conductive layer 20. The trenches are filled with insulated dielectric material 19. It should be noted that the term conductive material is used in this specification to mean material that can conduct, and thus includes semiconducting and resistive material.

P-type surface implants 21 extend parallel to the trenches across the first surface 5 of the semiconductor body, a pair of p-type surface implants 21 surrounding each insulated trench 17. A doped polysilicon conductive bridge 23 connects the p-type surface implants 21 across each trench 17. The trenches 17 define n-type regions 31 between adjacent trenches.

For clarity, the bridge 23 is omitted from FIG. 2 to allow the dielectric filling 19 and the surface implants 21 to be seen. Further, in view of the scale of FIG. 2, the p-type material 20 between the dielectric layer 19 and the surface implants 23 is also not shown, and only two trenches 17 are shown though in reality there may be more.

Front 25 and rear 27 contacts are provided on the first surface in the active region and on the second surface respectively of the semiconductor device to form a vertical semiconductor device.

The manufacture of the device may proceed by providing epitaxial layer 3 on substrate 1, and then forming a pattern of trenches 17 extending from the front surface 5 of the epitaxal layer 3 through epitaxial layer 3 towards the rear face 7. A thin p-type layer 20 is formed on the sidewalls of the trenches 17 by diffusing boron into the silicon sidewall. The trenches are then filled by the dielectric 19. Alternatively, the trenches can be filled with doped oxide and boron implanted or diffused into the silicon. Alternative dopants may also be used.

P-type surface implants 21 are then formed by ion implantation. Although not shown, this step may also deposit a p-type layer in the active region 11 to form a p-n semiconductor diode. Doped polysilicon 23 is then formed to connect adjacent surface implants 21.

Front and rear contacts 25,27 are then formed.

In use, with 0V applied to the front contact 25, the semiconductor device needs to withstand a large positive voltage on rear contact 27. The p-type material 20 causes depletion of the adjacent n-type regions 31 of the epitaxial layer in order that vertical breakdown does not occur.

The edge termination structure in the edge termination region 15 is designed to avoid breakdown in the edge region. The voltage drop between adjacent trench rings 17 is determined by the voltage required to deplete the n-type regions 31 between adjacent trenches.

Figure 3:
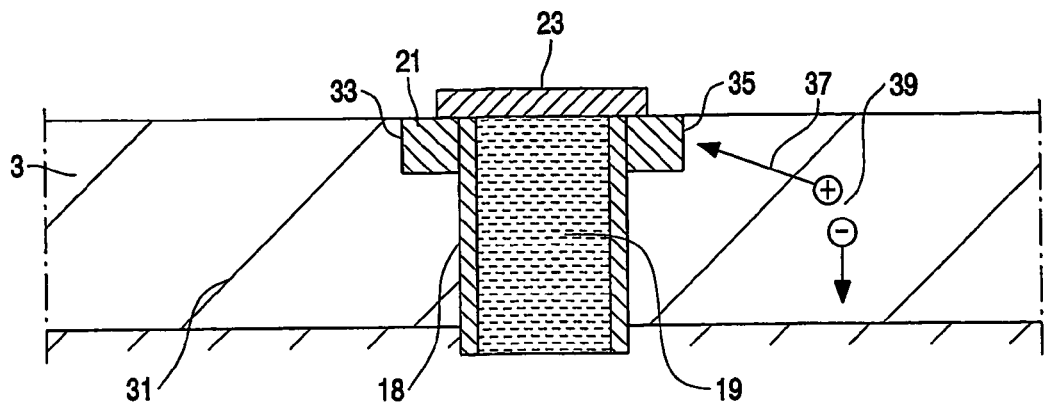
FIG. 3 illustrates the charge patterns in edge depletion structures.

In detail, referring to FIG. 3, the surface implants 21 in conjunction with regions 31 define forward bias p-n junctions 33 and reverse bias p-n junctions 35. Impact ionisation generates electron-hole pairs 39 which cause a small hole current at the reverse junctions 35. The exact bias of the floating p-type region 21 is determined by the condition that this hole current equals the hole flow across the forward-biased p-n junctions 33, to avoid hole build up in the surface implant regions 21.

Thus, if the conductive path 23 between the surface implants 21 on either side of the trench were not present, holes generated at the reverse junction 35 would not pass to the forward junction 33. The inventors have realised that this would mean that the mechanism for obtaining equilibrium simply cannot take place. Thus, the provision of the conductive path defined by metallisation 23 allows the edge termination structure to work properly.

Thus, the arrangement according to the invention allows edge termination structures to be used also for stripe or close-packed trench designs, by overcoming a problem that would otherwise occur with these designs. These designs are of particular commercial interest, since they offer better RESURF at the same pitch.

Figure 4:
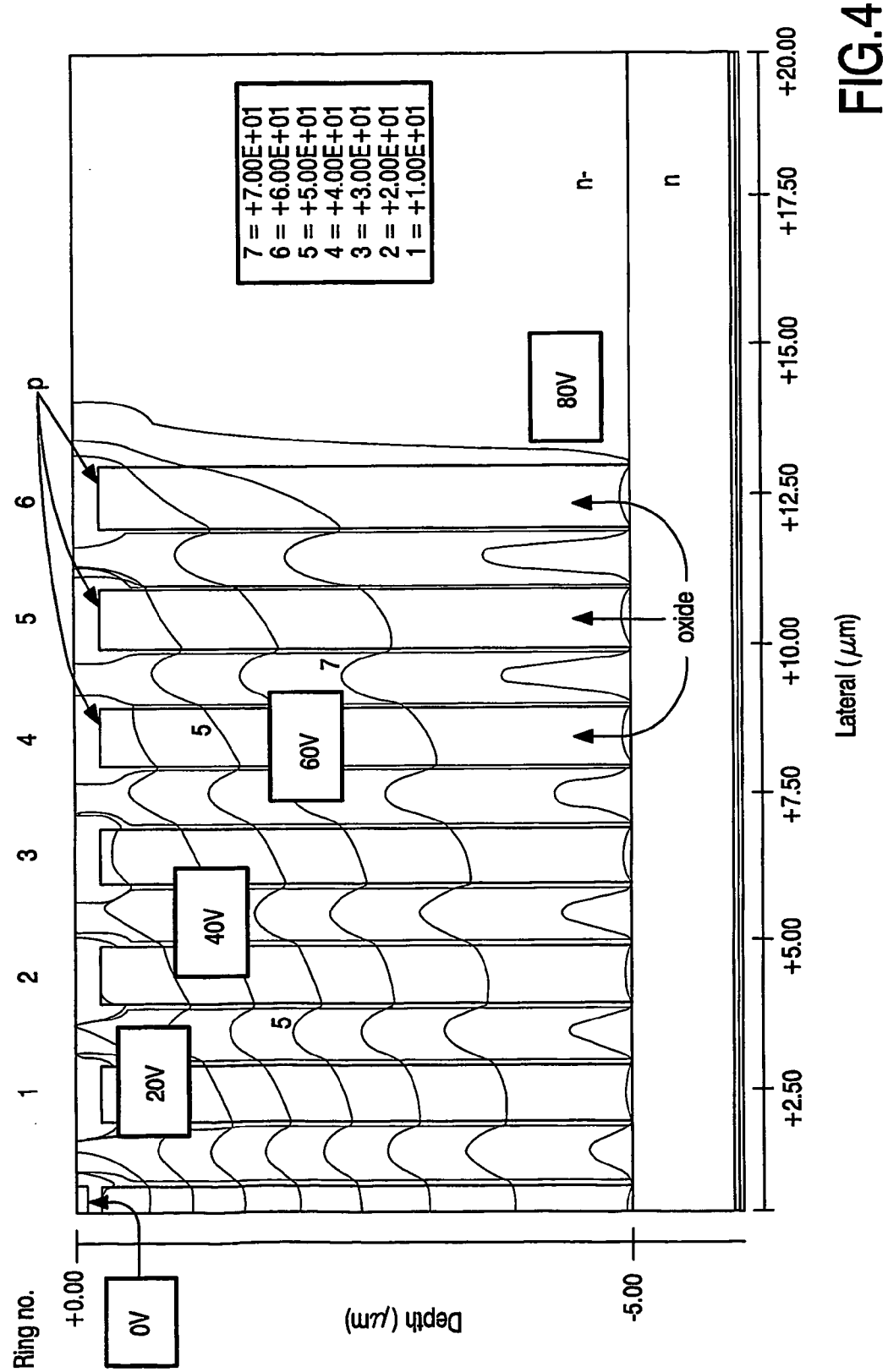
FIG. 4 shows the results of a numerical simulation of an edge termination scheme using such a floating ring structure.

The effectiveness of the invention is illustrated in FIG. 4, which illustrates calculated values of the potential drop in the edge region 15. A very gentle potential drop is shown to be achieved.

Figure 5A:
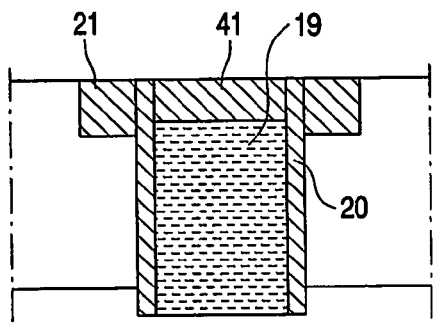
FIG. 5 shows alternative methods of connecting both sides of the surface implants.
Figure 5B:
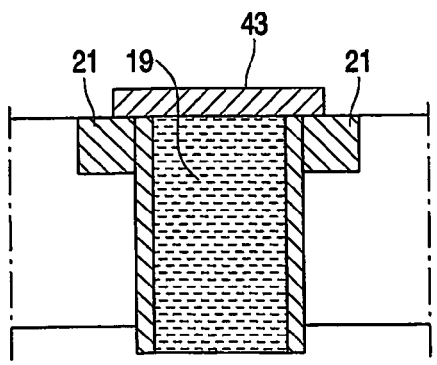

There are a number of possibilities to connect the surface implants 21 on both sides of the trench 17. FIG. 5a illustrates an approach in which the top of the dielectric 19 and p-type filling is etch back and the top of the trench then filled with doped polysilicon 41. In FIG. 5b, an alternative approach is described where metal 43 forms a bridge across the trench between surface implants 21 instead of the doped polysilicon 23 used in the arrangement shown in FIG. 1.

Figure 6:
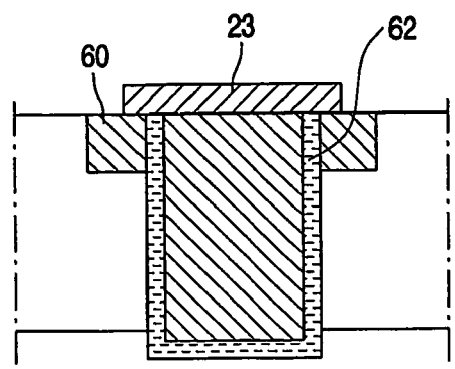
FIG. 6 shows alternative trench filling approaches.

An alternative method of forming an insulated trench is illustrated in FIG. 6. Dielectric 62 is grown on the sidewalls 18 of the trench 17 and then the trench is filled with p-doped polysilicon 60.

The invention is also applicable to the type of RESURF device having resistive material contained in a trench separated from an adjacent drift region by an insulating layer.

The invention is not restricted to the aforementioned types of RESURF device. For example, the invention is also applicable to devices using a deep trench lined with relatively thick oxide (200–400 nm) and filled with highly doped polysilicon or metal acting as a field plate. Such devices are known, for example from U.S. Pat. No. 5,365,102 (Mehrotra).

Figure 7:
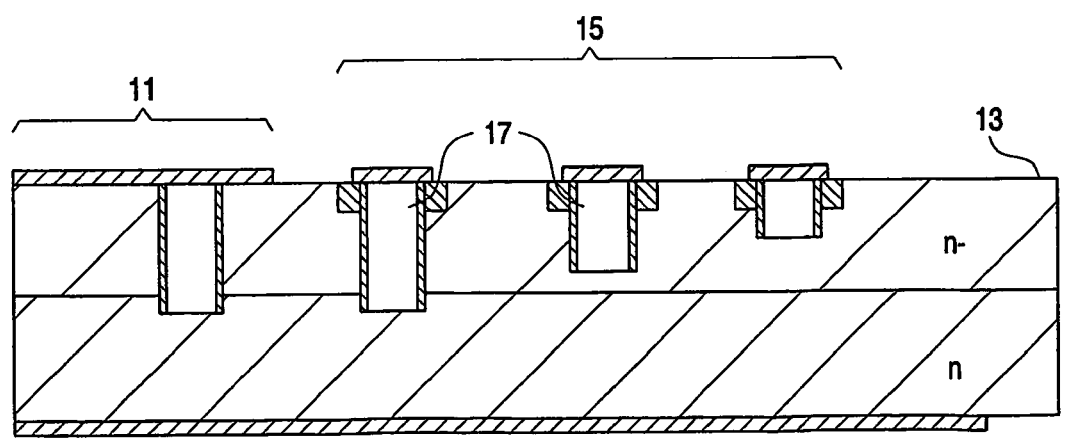
FIG. 7 shows an further embodiment of the invention having trenches of different depths.

A further embodiment of the invention, shown in FIG. 7, differs from that shown in FIG. 1 in that the depth of the trenches 17 adjacent to the central region 11 of the semiconductor device are deeper than the trenches adjacent to the periphery 13 of the semiconductor device.

This can reduce the total size of the edge termination region by allowing more volts to be dropped across the outer part of the edge termination region than would otherwise be the case. Where the trenches at the periphery of the edge termination region have the same structure as the trenches at the centre or the edge termination region, the properties and spacing of the trenches need to be determined by the higher electrical field present in the portion of the edge termination region adjacent to the central region, which causes the voltage dropped against the more peripheral paths of the edge termination region to be significantly less than the maximum obtainable.

Thus, the structure of FIG. 7 can save silicon real estate as compared with the structure of FIG. 1.

From reading the present disclosure, other variations and modifications will be apparent to persons skilled in the art. Such variations and modifications may involve equivalent and other features which are already known in the design, manufacture and use of semiconductor devices and which may be used in addition to or instead of features described herein. Although claims have been formulated in this application to particular combinations of features, it should be understood that the scope of disclosure also includes any novel feature or any novel combination of features disclosed herein either explicitly or implicitly or any generalisation thereof, whether or not it mitigates any or all of the same technical problems as does the present invention. The applicants hereby give notice that new claims may be formulated to any such features and/or combinations of such features during the prosecution of the present application or of any further applications derived therefrom.

The skilled person will realise that although the invention has been described for a device having a particular arrangement of n-type and p-type regions, these may be reversed.

The invention is applicable to semiconductor structures made of silicon, gallium arsenide, and any other semiconductor material.

The arrangement in the active region 11 may be varied as required depending on the desired structure—it is not essential that the active region is also a RESURF structure. However, the invention is of particular benefit in trench or close-packed RESURF structures.

The invention claimed is:

1. A semiconductor device with an edge termination structure, comprising:
   a semiconductor body having opposed first and second surfaces and an edge termination region at the periphery of the semiconductor body;
   a plurality of edge termination trenches extending across the edge termination region of the semiconductor body and vertically from the first surface towards the second surface of the semiconductor body through a region of a first conductivity type;
   conductive material extending vertically at the edge termination trenches for depleting the region of a first conductivity type between adjacent trenches;
   insulating material extending vertically at the edge termination trenches;
   surface implants of second conductivity type opposite to the first conductivity type extending parallel to and along both sides of the edge termination trenches adjacent to the first surface; and
   an electrically conductive path associated with each edge termination trench forming an electrical connection between the surface implants on both sides of the edge termination trench.

2. A semiconductor device according to claim 1 wherein the conductive material extending vertically at the trenches is semiconductor material of the second conductivity type.

3. A semiconductor device according to claim 1 or 2 wherein the electrically conductive path is formed by a conductive layer filling at least the portion of the edge termination, trenches adjacent to the first surface.

4. A semiconductor device according to claim 1 or 2 wherein the electrically conductive path is formed by a conductive layer extending over the first surface transversely across the edge termination trenches between the surface implants on both sides of the edge termination trenches.

5. A semiconductor device according to claim 1, wherein
   the edge termination trenches have sidewalls;
   the conductive material is a conductive layer along the sidewalls of the edge termination trenches extending downwards from the surface implants on both sides of the trench; and
   the insulating material fills the trenches between the conductive layers on the sides of the trench.

6. A semiconductor device according to claim 1, wherein the edge termination trenches have sidewalls;
   the insulating material is an insulating layer extending downwards on the sidewalls of the edge termination trenches;
   the conductive material fills the trench between the insulating material on the sidewalls.

7. A semiconductor device according to claim 1, wherein the electrically conductive path is of doped polysilicon.

8. A semiconductor device according to claim 1, wherein:
   the semiconductor body has a central active device region and a periphery;
   the edge termination region surrounds the central region of the semiconductor device within the periphery; and
   the plurality of trenches have different depths, the trenches adjacent to the central region of the semiconductor device being deeper than the trenches adjacent to the periphery.

9. A semiconductor device according to claim 1, wherein the semiconductor device has an active device region including a plurality of active region trenches extending laterally across the active device region and vertically from the first surface towards the second surface.

10. A method of manufacture of a semiconductor device, including
- providing a semiconductor body, having opposed first and second surfaces and a semiconductor region of first conductivity type adjacent to the first surface;
- forming trenches extending laterally across the semiconductor is body and vertically from the first surface towards the second surface;
- forming vertically extending conductive material and insulating material at each of the trenches;
- forming conducting semiconductor regions of second conductivity type opposite to the first conductivity type along both sides of the trenches in an edge termination region; and
- depositing conductive material on the first surface at the trenches to form a conductive path between the conducting semiconductor regions on both sides of the trenches.

* * * * *